(12) United States Patent
Hashizume et al.

(10) Patent No.: US 10,559,514 B2
(45) Date of Patent: Feb. 11, 2020

(54) SEMICONDUCTOR DEVICE

(71) Applicant: FUJI ELECTRIC CO., LTD., Kawasaki (JP)

(72) Inventors: Yuichi Hashizume, Matsumoto (JP); Keishirou Kumada, Matsumoto (JP); Yoshihisa Suzuki, Matsumoto (JP); Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 5 days.

(21) Appl. No.: 16/113,523

(22) Filed: Aug. 27, 2018

(65) Prior Publication Data
US 2019/0109065 A1 Apr. 11, 2019

(30) Foreign Application Priority Data
Oct. 5, 2017 (JP) .................. 2017-195430

(51) Int. Cl.
*H01L 29/15* (2006.01)
*H01L 23/367* (2006.01)
*H01L 29/417* (2006.01)
*H01L 29/45* (2006.01)
*H01L 29/16* (2006.01)
(Continued)

(52) U.S. Cl.
CPC ...... *H01L 23/367* (2013.01); *H01L 21/02378* (2013.01); *H01L 21/02433* (2013.01); *H01L 21/02529* (2013.01); *H01L 21/02576* (2013.01); *H01L 21/02634* (2013.01); *H01L 21/049* (2013.01); *H01L 21/0465* (2013.01); *H01L 21/0475* (2013.01); *H01L 21/0485* (2013.01); *H01L 29/0688* (2013.01); *H01L 29/0865* (2013.01); *H01L 29/0882* (2013.01); *H01L 29/1095* (2013.01); *H01L 29/1608* (2013.01); *H01L 29/36* (2013.01); *H01L 29/41741* (2013.01); *H01L 29/4236* (2013.01); *H01L 29/45* (2013.01); *H01L 29/4916* (2013.01); *H01L 29/66068* (2013.01); *H01L 29/66734* (2013.01); *H01L 29/7813* (2013.01); *H01L 23/3677* (2013.01); *H01L 29/0696* (2013.01); *H01L 29/7811* (2013.01)

(58) Field of Classification Search
CPC .................................................... H01L 23/367
USPC ......................................................... 257/77
See application file for complete search history.

(56) References Cited

U.S. PATENT DOCUMENTS

2012/0012861 A1* 1/2012 Nakano ............... H01L 29/1095
257/77
2018/0294350 A1* 10/2018 Utsumi ............... H01L 21/0485

FOREIGN PATENT DOCUMENTS

WO WO2010/110246 A1 9/2010

* cited by examiner

Primary Examiner — Ajay Arora

(57) ABSTRACT

An interlayer insulating film covers a gate electrode and a gate insulating film embedded in a trench. A source electrode includes a first TiN film, a NiSi film, a Ti film, a second TiN film, and an Al alloy film. The first TiN film covers a part of the interlayer insulating film so as to not contact a semiconductor substrate at a bottom of a contact hole. The NiSi film forms an ohmic contact with the semiconductor substrate in the contact hole. The Ti film, the second TiN film, and the Al alloy film are sequentially stacked on surfaces of the first TiN film and the NiSi film, spanning a front surface of the semiconductor substrate, from on the interlayer insulating film. A terminal pin is soldered to the source electrode 16, in an upright position orthogonal to the front surface of the semiconductor substrate.

6 Claims, 8 Drawing Sheets

(51) Int. Cl.
*H01L 29/06* (2006.01)
*H01L 29/08* (2006.01)
*H01L 29/10* (2006.01)
*H01L 21/02* (2006.01)
*H01L 21/04* (2006.01)
*H01L 29/36* (2006.01)
*H01L 29/49* (2006.01)
*H01L 29/78* (2006.01)
*H01L 29/66* (2006.01)
*H01L 29/423* (2006.01)

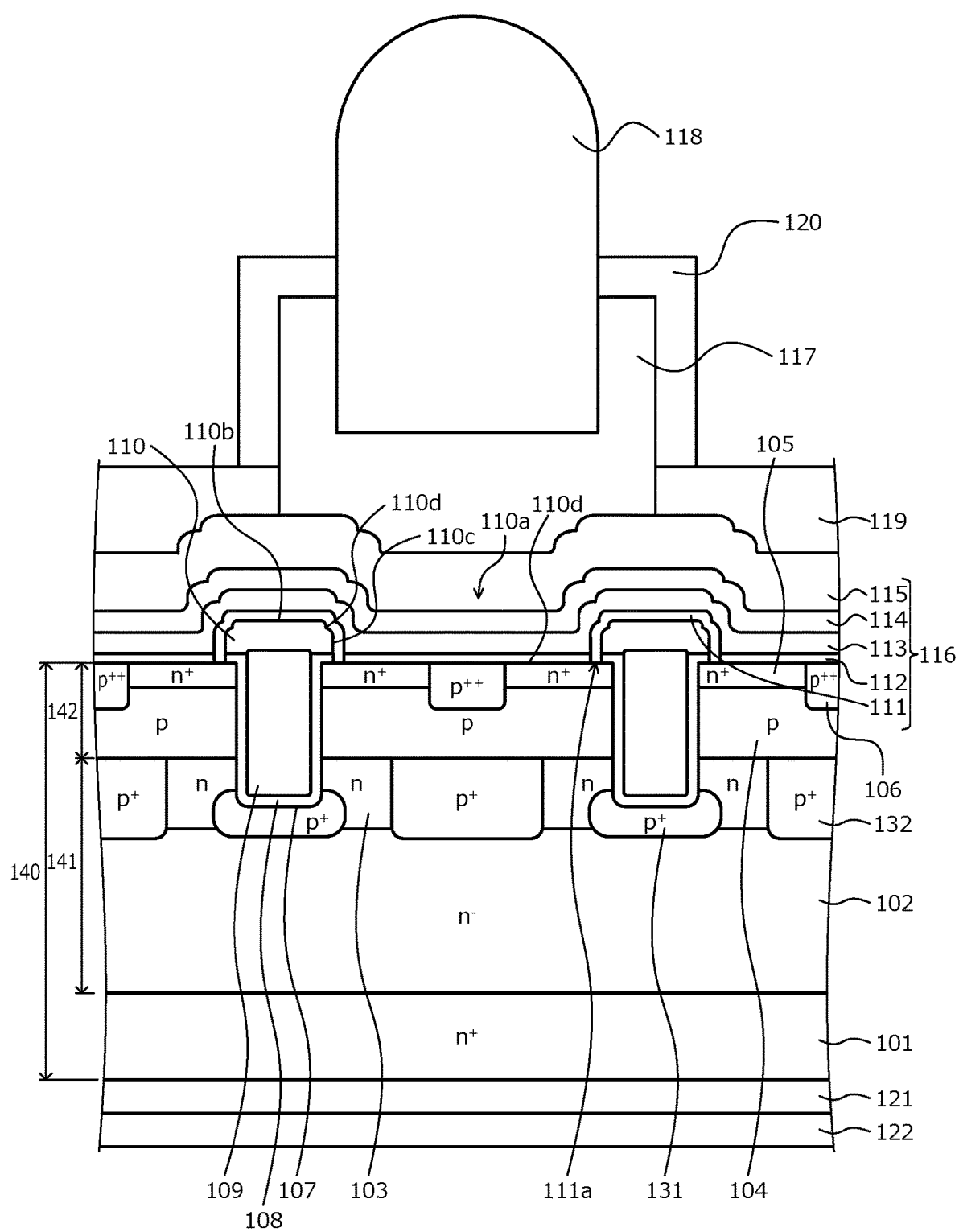

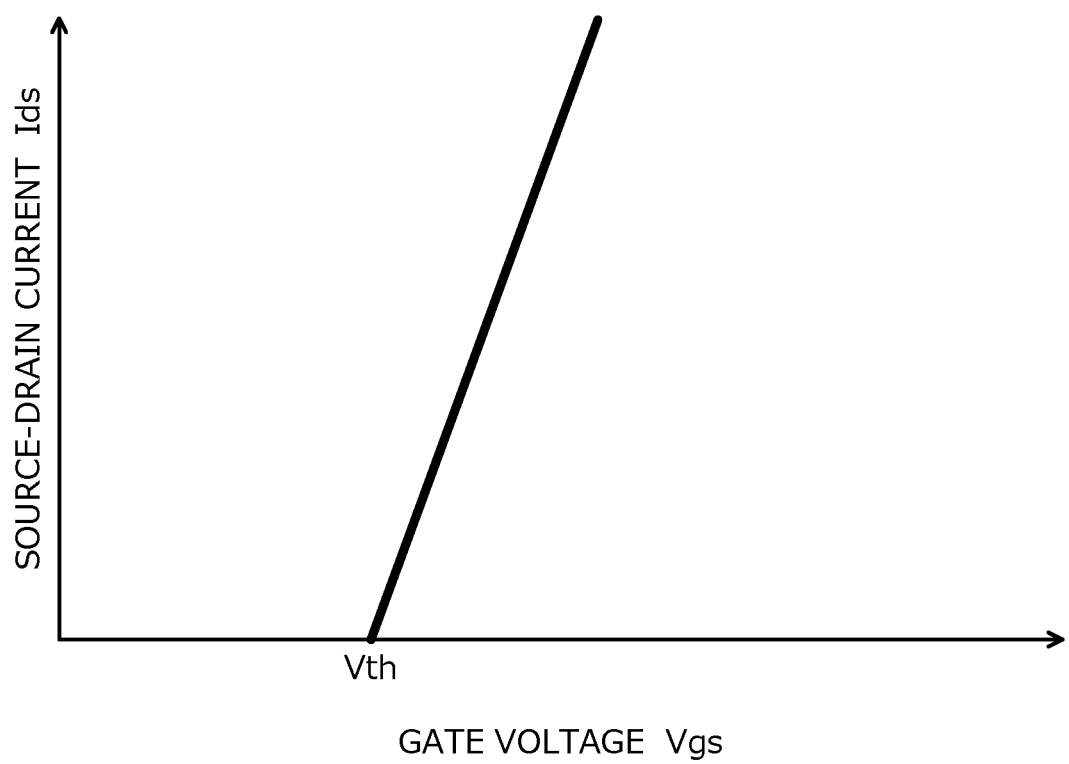

SEMICONDUCTOR DEVICE

CROSS REFERENCE TO RELATED APPLICATIONS

This application is based upon and claims the benefit of priority of the prior Japanese Patent Application No. 2017-195430, filed on Oct. 5, 2017, the entire contents of which are incorporated herein by reference.

BACKGROUND

1. Field

Embodiments of the invention relate to a semiconductor device.

2. Description of Related Art

A semiconductor material (hereinafter, wide bandgap semiconductor material) having a bandgap that is wider than that of silicon (Si) is attracting attention as a semiconductor material that may be used to fabricate (manufacture) next-generation power semiconductor devices that have a lower ON voltage, favorable high-speed characteristics and high-temperature characteristics. Further, conventionally, in a power semiconductor device that uses a wide bandgap semiconductor material, a trench gate structure is adopted in a vertical metal oxide semiconductor field effect transistor (MOSFET) that is a switching device and has an insulated gate constituted by a 3-layer structure of a metal oxide film semiconductor.

In a trench gate structure, which is a MOS gate structure in which a MOS gate is embedded in a trench formed in a front surface side of a semiconductor substrate (semiconductor chip), a channel (inversion layer) is formed along a side wall of the trench, in a direction orthogonal to the front surface of the semiconductor substrate. Therefore, compared to a planar gate structure in which a channel is formed along the front surface of the semiconductor substrate, a cell (constituent unit of an element) density per unit area may be increased and a current density per unit area may be increased, which is advantageous in terms of cost. The planar gate structure is a MOS gate structure in which a MOS gate is provided in a planar shape on the front surface of the semiconductor substrate.

Nonetheless, problems arise in that a temperature increase rate corresponding to a volume occupied by the cell increases by the amount of increased current density of the device, a bonding wire peels, etc. and therefore, to improve discharge efficiency and stabilize reliability, a double-sided cooling structure is necessary. A double-sided cooling structure is a structure that improves overall heat dissipation of a semiconductor substrate by allowing heat generated by the semiconductor substrate to escape from both sides of the semiconductor substrate. In the double-sided cooling structure, heat generated by the semiconductor substrate is radiated from a cooling fin that contacts a rear surface of the semiconductor substrate through a metal base plate and is radiated from a metal bar through the terminal pin having a first end mounted to the front surface of the semiconductor substrate and a second end mounted to the metal bar.

A conventional semiconductor device having a double-sided cooling structure will be described taking, as an example, a MOSFET that uses silicon carbide (SiC) as the wide bandgap semiconductor material. FIG. 11 is a cross-sectional view of a structure of the conventional semiconductor device. The conventional semiconductor device depicted in FIG. 11 includes at a front surface (surface on a side having a p-type silicon carbide layer 142) side of a semiconductor substrate 140 containing silicon carbide, a MOS gate having a typical trench gate structure. The semiconductor substrate 140 is an epitaxial substrate in which silicon carbide layers 141, 142 constituting an $n^-$-type drift region 102 and a p-type base region 104 are sequentially formed by epitaxial growth in order stated on a front surface of an $n^+$-type starting substrate 101 containing silicon carbide.

On the front surface of the semiconductor substrate 140, a source electrode (source pad) 116 is provided. The source electrode 116 forms in a contact hole 110a, an ohmic contact with an $n^+$-type source region 105 and a $p^{++}$-type contact region 106 and is electrically insulated from a gate electrode 109 by an interlayer insulating film 110. In particular, the source electrode 116 is formed by stacking on the front surface of the semiconductor substrate 140, a first titanium nitride (TiN) film 111, a nickel silicide (NiSi) film 112, a titanium (Ti) film 113, a second TiN film 114, and an aluminum (Al) film 115.

The first TiN film 111 functions as a barrier metal, preventing a diffusion of Ni atoms toward the interlayer insulating film 110 when the NiSi film 112 is formed. The first TiN film 111 covers an entire surface of the interlayer insulating film 110 and reaches a substrate front surface in the contact hole 110a. The entire surface of the interlayer insulating film 110 is a top (a flat part of the surface on a first side of the interlayer insulating film 110, opposite a second side thereof facing toward the gate electrode 109, the flat part being substantially parallel to the substrate front surface) 110b of the interlayer insulating film 110 and a side (side wall of the contact hole 110a) 110c of the interlayer insulating film 110. The NiSi film 112 forms an ohmic contact with the semiconductor substrate 140 (the $n^+$-type source region 105 and the $p^{++}$-type contact region 106).

The NiSi film 112 is provided only on a part (a bottom 110d of the contact hole 110a) of the semiconductor substrate 140 exposed in the contact hole 110a. The NiSi film 112 is that which remains only on the bottom 110d of the contact hole 110a when a nickel (Ni) film formed spanning the bottom 110d of the contact hole 110a from a surface of the first TiN film 111 is caused to react with the semiconductor substrate 140 and form a silicide. The Ti film 113, the second TiN film 114, and the Al film 115 are sequentially stacked in order state on surfaces of the first TiN film 111 and the NiSi film 112, spanning the NiSi film 112 from the first TiN film 111.

The Ti film 113 and the second TiN film 114 are barrier metals for obtaining a function other than the function by the first TiN film 111. The Al film 115 has favorable electrical conductivity and chemical stability. On the source electrode 116, a first end of a terminal pin 118 is mounted via a plating film 117 and solder layer (not depicted). A second end of the terminal pin 118 is mounted to a metal bar (not depicted) disposed so as to oppose the front surface of the semiconductor substrate 140. A part of a surface of the source electrode 116 excluding that covered by the plating film 117 is covered by a first protective film 119. A boundary of the plating film 117 and the first protective film 119 is covered by a second protective film 120.

A drain electrode 121 is in contact with a rear surface (rear surface of the $n^+$-type starting substrate 101) of the semiconductor substrate 140. On the drain electrode 121, a drain pad 122 is provided. The drain pad 122, at an entire surface, is mounted to a first main surface of the metal base plate (not depicted). A second main surface of the metal base plate is disposed so as to at least partially contact a base part of a cooling fin (not depicted). Reference numerals 103, 107, and 108 are an n-type current spreading region, a trench, and a gate insulating film, respectively. Reference numerals 131 and 132 are p$^+$-type regions that suppress electric field applied to the gate insulating film 108 when the MOSFET is in an OFF state.

Further, as a conventional semiconductor device that includes a front electrode of a stacked structure, a device has been proposed in which an ohmic metal is provided having a stacked structure in which a titanium film and a titanium nitride film are stacked in order stated on a top of an interlayer insulating film and on a bottom of a contact hole, and on the interlayer insulating film (on the ohmic metal), a source electrode containing aluminum as a principal component is embedded in a contact hole (for example, refer to International Publication No. WO 2010/110246 (paragraph 0042, FIGS. 3A and 16)).

SUMMARY

According to an embodiment, a semiconductor device includes a semiconductor substrate having a first main surface and a second main surface, and containing a semiconductor material that has a bandgap wider than that of silicon; a first semiconductor layer of a first conductivity type provided in the semiconductor substrate; a second semiconductor layer of a second conductivity type provided in the semiconductor substrate, the second semiconductor layer being closer to the first main surface than is the first semiconductor layer, the second semiconductor layer being in contact with the first semiconductor layer and exposed at the first main surface; a first first-conductivity-type semiconductor region of the first conductivity type selectively formed in the second semiconductor layer; a trench penetrating the first first-conductivity-type semiconductor region and the second semiconductor layer, and reaching the first semiconductor layer; a gate insulating film provided in the trench, along an inner wall of the trench; a gate electrode provided on the gate insulating film in the trench; an interlayer insulating film provided on the first main surface of the semiconductor substrate and covering the gate insulating film and the gate electrode; a contact hole penetrating the interlayer insulating film in a depth direction and reaching the first main surface of the semiconductor substrate; a first electrode forming an ohmic contact with the first first-conductivity-type semiconductor region and the second semiconductor layer in the contact hole; a terminal pin soldered to the first electrode via a plating film; and a second electrode provided on the second main surface of the semiconductor substrate. The first electrode includes: a first titanium nitride film provided separated from the first main surface of the semiconductor substrate exposed in the contact hole, the first titanium nitride film covering a part of the interlayer insulating film; a silicide film forming the ohmic contact and provided on the first main surface of the semiconductor substrate exposed in the contact hole; an aluminum-based metal film containing aluminum as a principal component and provided on the first main surface of the semiconductor substrate, from on the interlayer insulating film, the aluminum-based metal film covering the first titanium nitride film and the silicide film.

In the embodiment, the first titanium nitride film covers only a flat part of the interlayer insulating film, the flat part being parallel to the front main surface and on a first side of the interlayer insulating film, opposite a second side facing toward the gate electrode.

In the embodiment, the first titanium nitride film terminates along the flat part before reaching a boundary of a side of the interlayer insulating film and the flat part.

In the embodiment, the first titanium nitride film has a width that is at least a width of the trench.

In the embodiment, the first electrode includes: a titanium film that is between the first titanium nitride film and the aluminum-based metal film, and between the silicide film and the aluminum-based metal film, the titanium film being provided on the first main surface of the semiconductor substrate, from on the interlayer insulating film, the titanium film covering the first titanium nitride film and the silicide film; and a second titanium nitride film provided on the titanium film. The aluminum-based metal film is provided on the second titanium nitride film.

In the embodiment, the semiconductor device further includes a first second-conductivity-type semiconductor region of the second conductivity type, selectively provided in the first semiconductor layer, separated from the second conductor layer and beneath a bottom of the trench; and a second second-conductivity-type semiconductor region of the second conductivity type, selectively provided in the first semiconductor layer between the trench and an adjacent trench, the second second-conductivity-type semiconductor region being separated from the first second-conductivity-type semiconductor region and in contact with the second semiconductor layer.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 11 is a cross-sectional view of a structure of a conventional semiconductor device;

FIG. 12 is a characteristics diagram of a relationship of gate voltage of a typical MOSFET and source-drain current.

DESCRIPTION OF EMBODIMENTS

Figure 1:
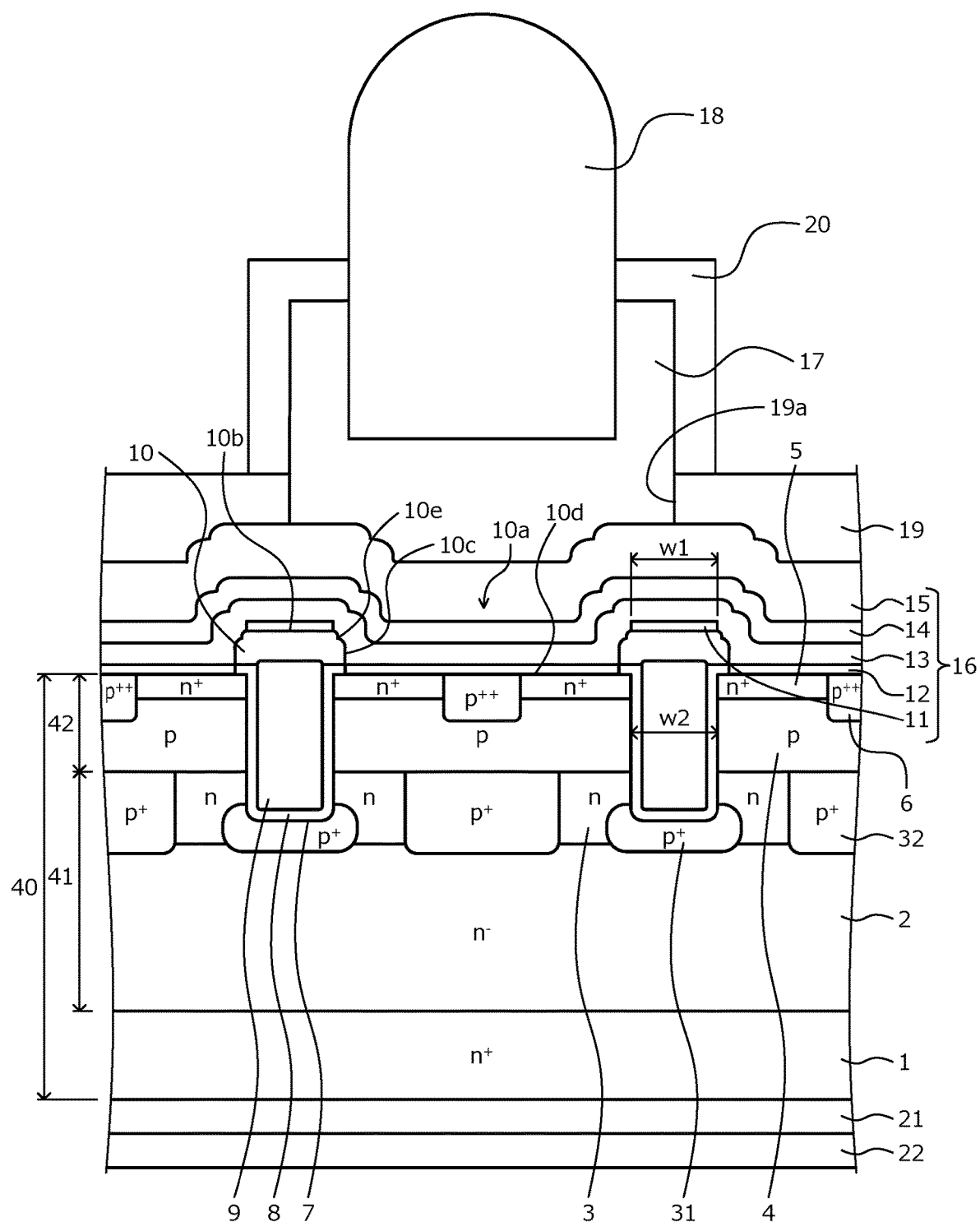
FIG. 1 is a cross-sectional view of a structure of a semiconductor device according to an embodiment.

First problems associated with the techniques above will be discussed. In the described conventional semiconductor device having a double-sided cooling structure (refer to FIG.

11), stress applied to the source electrode 116 is large at a part where the terminal pin 118 is mounted and stress applied to the gate electrode 109 is also large at this part. Therefore, the first TiN film 111 is provided so as to cover the entire surface of the interlayer insulating film 110 to make the stress applied to the source electrode 116 uniform, whereby stress applied to the gate electrode 109 from a direction of the terminal pin 118 is mitigated. However, when the first TiN film 111 is provided so as to cover the entire surface of the interlayer insulating film 110, the first TiN film 111 contacts the semiconductor substrate 140 in the contact hole 110a. As a result, at a contact site 111a with the semiconductor substrate 140, the stress applied to the first TiN film 111 increases and the following problem arises.

FIG. 12 is a characteristics diagram of a relationship of gate voltage of a typical MOSFET and source-drain current. In general, when stress applied to a gate electrode is made uniform and voltage (gate voltage) Vgs that is equal to or higher than a gate threshold voltage Vth between the gate and source is applied, current (flowing in the channel) Id that flows between the source and drain has a proportional relationship with the gate voltage Vgs and is larger the higher the gate voltage Vgs is (FIG. 12). On the other hand, as described, when the stress applied to the first TiN film 111 increases at the contact site 111a with the semiconductor substrate 140, a current value of the source-drain current Ids fluctuates at a particularly low current value. In other words, the electric field applied to the gate insulating film 108 varies and therefore, a rise (the gate threshold voltage Vth) of the gate voltage Vgs varies from the initial characteristics (design value) over time (refer to FIG. 10 described hereinafter). Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Further, in the present description, when Miller indices are described, "−" means a bar added to an index immediately after the "−", and a negative index is expressed by prefixing "−" to the index.

The semiconductor device according to an embodiment is configured using a semiconductor material (wide bandgap semiconductor material) that has a bandgap that is wider than that of silicon (Si). A structure of the semiconductor device according to the embodiment will be described taking as an example, a case in which, for example, silicon carbide (SiC) is used as the wide bandgap semiconductor material. FIG. 1 is a cross-sectional view of a structure of the semiconductor device according to the embodiment. In FIG. 1, only two adjacent unit cells (each a constituent unit of an element) disposed in an active region are depicted, and other unit cells in the active region and an edger termination region surrounding a periphery of the active region are not depicted (similarly in FIGS. 2 to 7).

The active region is a region in which current flows when the semiconductor device is in an ON state. The edge termination region is a region between the active region and a chip (a semiconductor substrate 40) side surface, and is a region that mitigates electric field of an n$^-$-type drift region 2, at a substrate front surface (the front surface of the semiconductor substrate 40 (first main surface)) side, and sustains a breakdown voltage. In the edge termination region, for example, a breakdown voltage structure such as a p-type region constituting a guard ring or a junction termination extension (JTE) structure, a field plate, RESURF, etc. is disposed. The breakdown voltage is a voltage limit that does not cause malfunction or destruction of the semiconductor device.

The semiconductor device according to the embodiment depicted in FIG. 1 is a vertical MOSFET that includes a MOS gate having a trench gate structure on a front surface (surface on side having a p-type base region 4) side of the semiconductor substrate 40 containing silicon carbide. The semiconductor substrate 40 is an epitaxial substrate (semiconductor chip) formed by sequentially forming by epitaxial growth on an n$^+$-type starting substrate 1 containing silicon carbide, silicon carbide layers (a first and a second semiconductor layers) 41, 42 constituting the n$^-$-type drift region 2 and the p-type base region 4. The MOS gate is constituted by the p-type base region 4, an n$^+$-type source region (first first-conductivity-type semiconductor region) 5, a p$^{++}$-type contact region 6, a trench 7, a gate insulating film 8, and a gate electrode 9.

In particular, the trench 7 penetrates the p-type silicon carbide layer 42 (the p-type base region 4) in a depth direction from the front surface of the semiconductor substrate 40 (surface of the p-type silicon carbide layer 42) and reaches the n$^-$-type silicon carbide layer 41. The depth direction is a direction from the front surface of the semiconductor substrate 40 toward a rear surface (second main surface). In the trench 7, the gate insulating film 8 is provided along an inner wall (side wall and bottom) of the trench 7; and on the gate insulating film 8, the gate electrode 9 is provided so as to be embedded in the trench 7. The gate electrode 9 in a single trench 7 and adjacent mesa regions (each a region between adjacent trenches 7) that sandwich the gate electrode 9 in the single trench 7 constitute one unit cell.

In a surface layer on a source side (side facing toward a source electrode (first electrode) 16) of the n$^-$-type silicon carbide layer 41, an n-type region (hereinafter, n-type current spreading region) 3 is provided so as to be in contact with the p-type silicon carbide layer 42 (the p-type base region 4). The n-type current spreading region 3 lowers a carrier spread resistance and is a so-called current spreading layer (CSL). The n-type current spreading region 3, for example, is provided uniformly in a direction parallel to the substrate front surface, so as to be exposed at the inner wall of the trench 7. The n-type current spreading region 3, from an interface with the p-type base region 4, reaches a deep position that is closer to a drain (drain electrode (second electrode) 21) than is the bottom of the trench 7.

A part of the n$^-$-type silicon carbide layer 41 excluding the n-type current spreading region 3 is the n$^-$-type drift region 2. In the n-type current spreading region 3, a first and a second p$^+$-type regions 31, 32 are each selectively provided. The p$^+$-type region 31 is beneath the bottom of the trench 7. When the p$^+$-type region 31 is in contact with the trench, the p$^+$-type region 31 may be in contact with the bottom and a bottom corner part of the trench 7 overall. The bottom corner part of the trench 7 is a boundary of the bottom and a side wall of the trench 7. Further, the p$^+$-type region 31 is provided separated from the p-type base region 4, at a deep position closer to the drain than is an interface of the p-type base region 4 and the n-type current spreading region 3.

The second p$^+$-type region 32 is provided between (mesa region) the adjacent trenches 7, separated from the p$^+$-type region 31 and the trench 7, and in contact with the p-type base region 4. Pn junctions of the first and the second p$^+$-type regions 31, 32 with the n-type current spreading region 3 (or the n$^-$-type drift region 2) are formed at a deep position closer to the drain than is the bottom of the trench 7. As a result, an application of high electric field to the gate insulating film 8 at a part along the bottom of the trench 7 may be prevented. The first and the second p$^+$-type regions 31, 32 may be provided in the n$^-$-type drift region 2 without providing the n-type current spreading region 3.

Depth positions of edges of the first and the second p$^+$-type regions 31, 32 toward the drain may be variously changed according to design conditions provided that the pn junctions of the first and the second p$^+$-type regions 31, 32 with the n-type current spreading region 3 (or the n$^-$-type drift region 2) are at a deep position closer to the drain than is the bottom of the trench 7. For example, the edges of the first and the second p$^+$-type regions 31, 32 toward the drain may terminate in the n-type current spreading region 3 or in the n$^-$-type drift region 2, closer to the drain than is the bottom of the trench 7, or may terminate at an interface of the n-type current spreading region 3 and the n$^-$-type drift region 2.

In the p-type silicon carbide layer 42, the n$^+$-type source region 5, and the p$^{++}$-type contact region 6 are each selectively provided so as to be in contact with each other. The n$^+$-type source region 5 is in contact with the gate insulating film 8 at the side wall of the trench 7, and opposes the gate electrode 9 across the gate insulating film 8 at the side wall of the trench 7. The p$^{++}$-type contact region 6 is provided closer to a center of the mesa region than is the n$^+$-type source region 5. The p$^{++}$-type contact region 6, for example, opposes the second p$^+$-type region 32 in the depth direction. A part of the p-type silicon carbide layer 42 excluding the n$^+$-type source region 5 and the p$^{++}$-type contact region 6 is the p-type base region 4.

An interlayer insulating film 10 is provided on the entire substrate front surface so as to cover the gate insulating film 8 and the gate electrode 9 embedded in the trench 7. All of the gate electrodes 9 are electrically connected to a gate pad (non-depicted electrode pad) at a non-depicted part. In the interlayer insulating film 10, a contact hole 10a is opened penetrating the interlayer insulating film 10 in the depth direction and reaching the substrate front surface. The source electrode (source pad (electrode pad)) 16 forms an ohmic contact with the semiconductor substrate 40 (the n$^+$-type source region 5 and the p$^{++}$-type contact region 6) in the contact hole 10a and is electrically insulated from the gate electrode 9 by the interlayer insulating film 10.

In particular, the source electrode 16 has a first titanium nitride (TiN) film 11, a nickel silicide (NiSi) film 12, and an aluminum (Al) alloy film 15. The source electrode 16 may further have between the first TiN film 11 and the Al alloy film 15 and between the NiSi film 12 and the Al alloy film 15, a titanium (Ti) film 13 and a second TiN film 14.

The first TiN film 11 partially covers the interlayer insulating film 10 so as to be in contact with a part (a bottom 10d of the contact hole 10a) of the semiconductor substrate 40 exposed in the contact hole 10a. The first TiN film 11 needs not be in contact with the bottom 10d of the contact hole 10a and needs not be provided on a side (side wall of the contact hole 10a) 10c of the interlayer insulating film 10, or a top corner part (a boundary of the top 10b of the interlayer insulating film 10 and the side 10c of the interlayer insulating film 10) 10e of the interlayer insulating film 10.

In particular, the first TiN film 11 may cover only a top (flat part of a surface on a first side of the interlayer insulating film 10, opposite a second side thereof facing toward the gate electrode 9, the flat part being substantially parallel to the substrate front surface) 10b of the interlayer insulating film 10. Additionally, the first TiN film 11 has a width w1 of a magnitude so that the first TiN film 11 opposes in the depth direction, the gate electrode 9 and a part of the gate insulating film 8 along the inner wall of the trench 7. In other words, the width w1 of the first TiN film 11 is equal to or greater than the width w2 of the trench 7.

The first TiN film 11 has a function of preventing a salt that is generated in a treatment solution of a pre-plating process from invading the gate insulating film 8 and the gate electrode 9. The pre-plating process is surface treatment for preparing a surface that is to be plated (surface of an Al alloy film 15) to be in a clean state suitable for plating and is performed before a plating process for forming a plating film 17 described hereinafter.

Further, the first TiN film 11 is interposed between the interlayer insulating film 10 and a nickel (Ni) film that is a material source of the NiSi film 12 when the NiSi film 12 is formed, and when material source film (Ni film) residue after etching remains after formation of the NiSi film 12, the first TiN film 11 has a function of suppressing a diffusion of Ni atoms from the etching residue toward the interlayer insulating film 10.

The NiSi film 12 forms, in the contact hole 10a, an ohmic contact with the semiconductor substrate 40 (the n$^+$-type source region 5 and the p$^{++}$-type contact region 6). The NiSi film 12 is provided only on the bottom 10d of the contact hole 10a. The NiSi film 12 is that which remains only on the bottom 10d of the contact hole 10a after a Ni film formed spanning the bottom 10d of the contact hole 10a, from the surface of the first TiN film 11, is caused to react with the semiconductor substrate 40 and form a silicide. When, for example, a titanium silicide (TiSi) film is provided instead of the NiSi film 12, formation of an ohmic contact with the semiconductor substrate 40 is possible.

The Ti film 13 is provided on the front surface of the semiconductor substrate 40, spanning from on the interlayer insulating film 10, and covering the first TiN film 11 and the NiSi film 12. The second TiN film 14 is provided on the Ti film 13. The Al alloy film 15 is provided on the second TiN film 14 so as to be embedded in the contact hole 10a. The Ti film 13 and the second TiN film 14 are barrier metals for obtaining a function other than the function obtained by the first TiN film 11. The Ti film 13 has a function of occluding hydrogen (H) atoms and hydrogen ions generated from the Al alloy film 15, and blocking the hydrogen (H) atoms and hydrogen ions from reaching the interlayer insulating film 10 below. The hydrogen atoms and hydrogen ions are particles that are a smallest constituent unit as a hydrogen atom, more specifically, the hydrogen atoms and hydrogen ions are hydrogen atoms, hydrogen ions, and hydrogen molecules.

The second TiN film 14 has a function of mitigating stress applied to a layer beneath the second TiN film 14, from a terminal pin 18 described hereinafter. The Al alloy film 15 is a metal film containing aluminum as a principal component and has favorable electrical conductivity and chemical stability. The Al alloy film 15 may be, for example, an aluminum-silicon (Al—Si) film, an aluminum-silicon-copper (Al—Si—Cu) film, or an aluminum-copper (Al—Cu) film. An aluminum film may be provided instead of the Al alloy film 15. On the source electrode 16, a first end of the terminal pin 18 is mounted via the plating film 17 and the solder layer (not depicted).

A second end of the terminal pin 18 is mounted to a metal bar (not depicted) disposed opposing the front surface of the semiconductor substrate 40. Further, the second end of the terminal pin 18 is exposed outside a case (not depicted) in which the semiconductor chip (the semiconductor substrate 40) is mounted and is electrically connected to an external device (not depicted). In other words, the terminal pin 18, for example, is an external connection terminal leading out potential of the source electrode 16. The terminal pin 18 a round bar-shaped (cylindrical) wiring member having a predetermined diameter, and is soldered to the plating film 17 in an upright state substantially orthogonal to the front surface of the semiconductor substrate 40.

The plating film 17, even under high temperature conditions (for example, 200 degrees C. to 30 degrees C.), has adhesion with the source electrode 16 and is less likely to peel as compared to wire bonding. A part of a surface of the source electrode 16 other than that covered by the plating film 17 is covered by a first protective film 19. In particular, the first protective film 19 is provided so as to cover the source electrode 16, and the terminal pin 18 is mounted thereto in an opening of the first protective film 19, via the plating film 17 and the solder layer. A boundary of the plating film 17 and the first protective film 19 are covered by a second protective film 20. The first and the second protective films 19, 20 are, for example, polyimides films.

The drain electrode 21 forms an ohmic contact with the rear surface (the rear surface of the n$^+$-type starting substrate 1 that is an n$^+$-type drain region) of the semiconductor substrate 40. On the drain electrode 21, a drain pad (electrode pad) 22 is provided. The drain pad 22 is soldered to the metal base plate (not depicted) and at least partially contacts a base part of a cooling fin (not depicted) through the metal base plate. A double-sided cooling structure is configured in which heat generated by the semiconductor substrate 40 is radiated from a fin part of the cooling that is in contact with the rear surface of the semiconductor substrate 40 through the metal base plate, and the heat is further radiated from the metal bar to which the terminal pin 18 of the front surface of the semiconductor substrate 40 is mounted.

Figure 2:
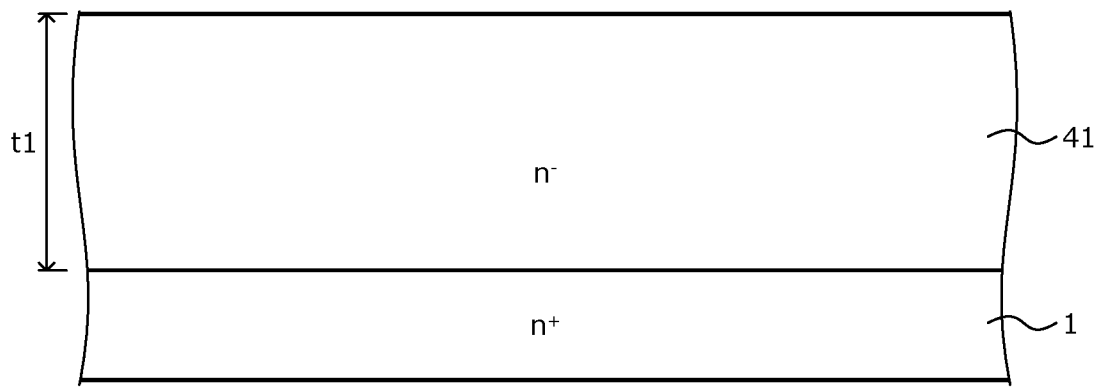
FIG. 2 is a cross-sectional view of the semiconductor device according to the embodiment during manufacture.

A method of manufacturing the semiconductor device according to the embodiment will be described. FIGS. 2, 3, 4, 5, 6, 7, and 8 are cross-sectional views of the semiconductor device according to the embodiment during manufacture. First, as depicted in FIG. 2, the n$^+$-type starting substrate (semiconductor wafer) 1 containing silicon carbide is prepared. The n$^+$-type starting substrate 1 may be a silicon carbide single crystal substrate doped with, for example, nitrogen (N). A front surface of the n$^+$-type starting substrate 1 may be, for example, a (0001) plane, a so-called Si face. Next, on the front surface of the n$^+$-type starting substrate 1, the n$^-$-type silicon carbide layer 41 doped with nitrogen at a lower concentration than that of the n$^+$-type starting substrate 1 is formed by epitaxial growth. The n$^-$-type silicon carbide layer 41 has a thickness t1 that may be, for example, about 30 µm.

Next, by photolithography and ion implantation of a p-type impurity such as aluminum, for example, in a surface layer of the n$^-$-type silicon carbide layer 41, the p$^+$-type region 31 and the p$^+$-type region (hereinafter, a p$^+$-type sub-region) 32a are each selectively formed. The p$^+$-type sub-region 32a is a part of the second p$^+$-type region 32. The p$^+$-type region 31 and the p$^+$-type sub-region 32a are disposed alternating and repeating in a direction parallel to the front surface of the n$^+$-type starting substrate 1. The p$^+$-type region 31 and the p$^+$-type sub-region 32a each has a depth d1 and an impurity concentration that may be, for example, about 0.5 µm and about 5.0×10$^{18}$/cm$^3$, respectively. A distance d2 between the p$^+$-type region 31 and the p$^+$-type sub-region 32a that are adjacent may be, for example, about 1.5 µm.

Next, by photolithography and ion implantation of an n-type impurity such as nitrogen, for example, spanning the active region overall, an n-type region (hereinafter, n-type sub-region) 3a is formed in the surface layer of the n$^-$-type silicon carbide layer 41. The n-type sub-region 3a is a part of the n-type current spreading region 3. The n-type sub-region 3a may have an impurity concentration of, for example, about 1.0×10$^{17}$/cm$^3$. A part of the n$^-$-type silicon carbide layer 41 closer to the drain than is the n-type sub-region 3a constitutes the n$^-$-type drift region 2. At this time, a depth d3 of the n-type sub-region 3a may be variously changed with respect to a depth d1 of the p$^+$-type region 31 and the p$^+$-type sub-region 32a, whereby a depth of an edge of the second p$^+$-type region 32 toward the drain is determined with respect to the n-type current spreading region 3.

Figure 3:
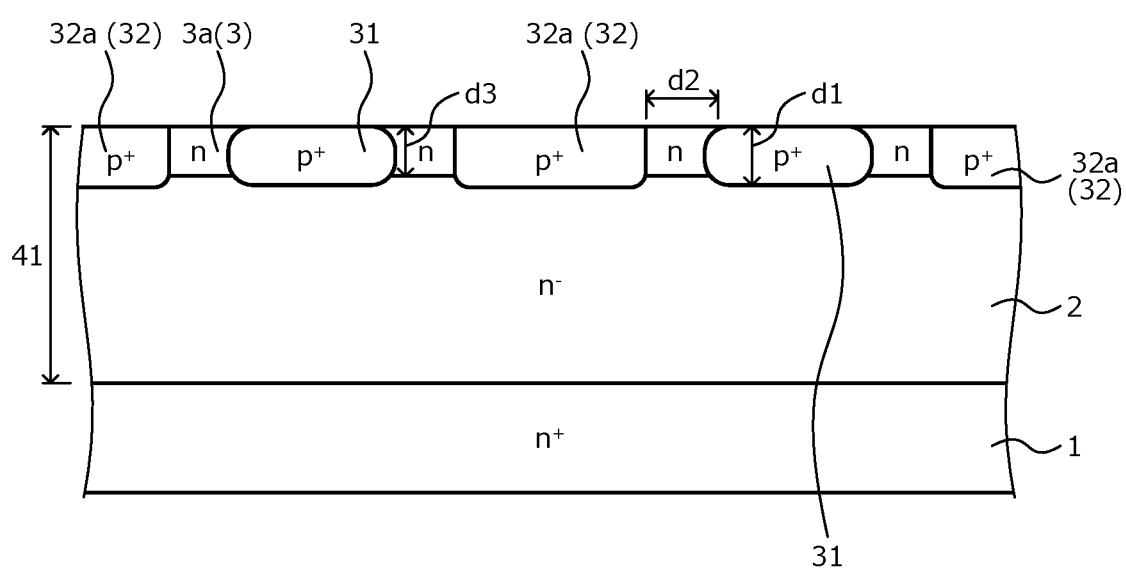
FIG. 3 is a cross-sectional view of the semiconductor device according to the embodiment during manufacture.

For example, when the edge of the second p$^+$-type region 32 toward the drain is terminated closer to the drain than is the n-type current spreading region 3, as depicted in FIG. 3, the depth d3 of the n-type sub-region 3a is shallower than that of the p$^+$-type region 31 and the p$^+$-type sub-region 32a. In this case, the depth d3 of the n-type sub-region 3a may be, for example, about 0.4 µm. Further, when the edge of the second p$^+$-type region 32 toward the drain is terminated in the n-type current spreading region 3, the depth d3 of the n-type sub-region 3a is deeper than that of the p$^+$-type region 31 and the p$^+$-type sub-region 32a, and the n-type sub-region 3a is beneath entire respective sides of the p$^+$-type region 31 and the p$^+$-type sub-region 32a, facing toward the drain (respective sides facing toward the n$^+$-type starting substrate 1). A sequence in which the n-type sub-region 3a, the p$^+$-type region 31, and the p$^+$-type sub-region 32a are formed may be interchanged.

Figure 4:
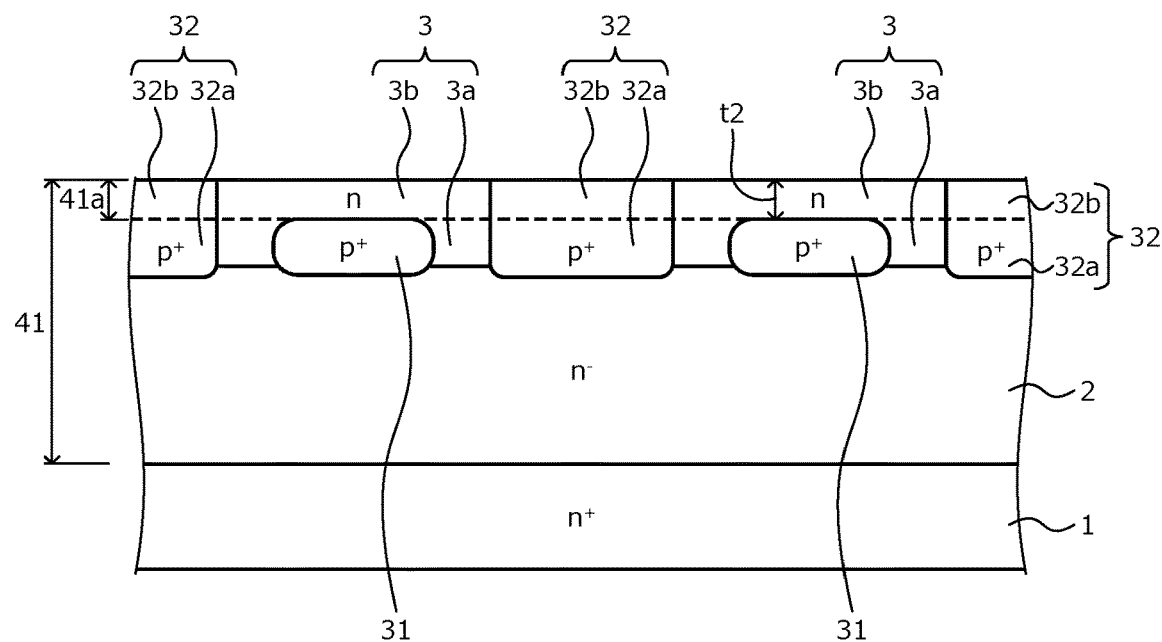
FIG. 4 is a cross-sectional view of the semiconductor device according to the embodiment during manufacture.

Next, as depicted in FIG. 4, on the n$^-$-type silicon carbide layer 41, an n$^-$-type silicon carbide layer doped with an n-type impurity such as nitrogen, for example, is formed by epitaxial growth and has a thickness t2 of, for example, 0.5 µm, whereby a thickness of the n$^-$-type silicon carbide layer 41 is increased. The n$^-$-type silicon carbide layer 41 may have an impurity concentration of, for example, about 3.0×10$^{15}$/cm$^3$ uniform in the depth direction from a part (surface layer of the n$^-$-type silicon carbide layer 41) 41a that increased the thickness of the n$^-$-type silicon carbide layer 41, to a boundary with the n$^+$-type starting substrate 1.

Next, by photolithography and ion implantation of a p-type impurity such as aluminum, in the part 41a that increased the thickness of the n$^-$-type silicon carbide layer 41, at parts thereof opposing the p$^+$-type sub-regions 32a in the depth direction, a p$^+$-type sub-region 32b is selectively formed at a depth reaching the p$^+$-type sub-regions 32a. The p$^+$-type sub-region 32b has a width and an impurity concentration that are, for example, substantially equal to those of the p$^+$-type sub-region 32a. The p$^+$-type sub-regions 32a, 32b are connected in the depth direction, thereby forming the second p$^+$-type region 32.

Next, by photolithography and ion implantation of an n-type impurity such as nitrogen, for example, across the entire active region, in the part 41a that increased the thickness of the n$^-$-type silicon carbide layer 41, an n-type sub-region 3b is formed at a depth reaching the n-type sub-region 3a. The n-type sub-region 3b has an impurity concentration that is substantially equal to that of the n-type sub-region 3a. The n-type sub-regions 3a, 3b are connected in the depth direction, thereby forming the n-type current spreading region 3. A sequence in which the p$^+$-type sub-region 32b and the n-type sub-region 3b are formed may be interchanged.

Figure 5:
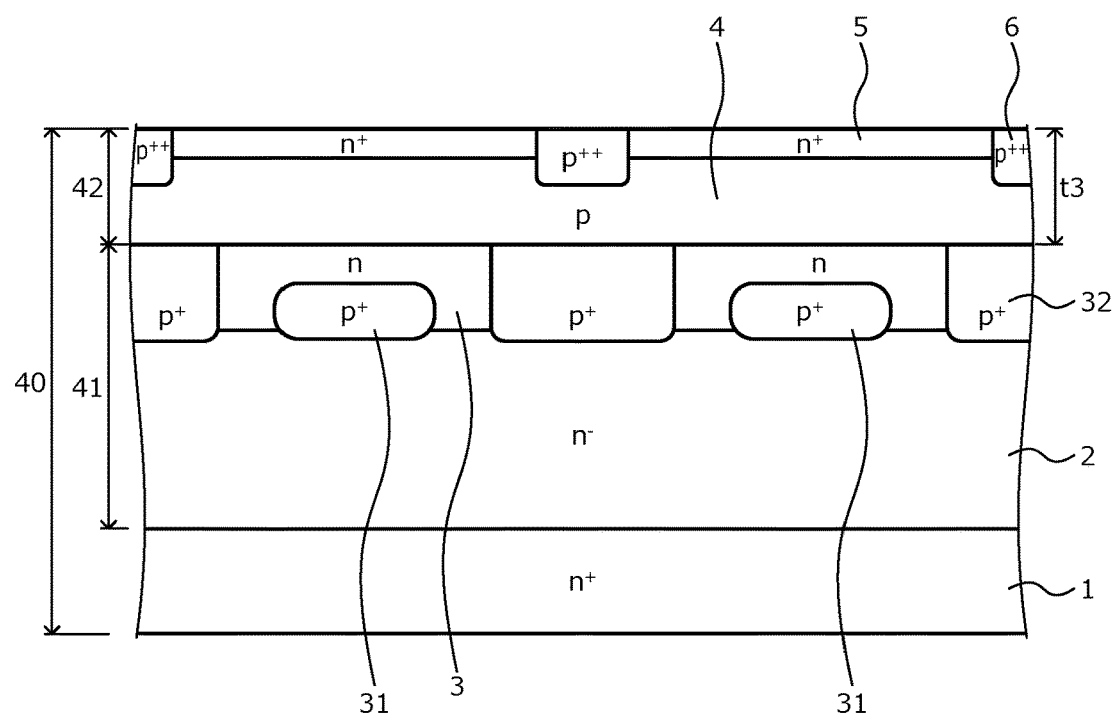
FIG. 5 is a cross-sectional view of the semiconductor device according to the embodiment during manufacture.

Next, as depicted in FIG. 5, on the n⁻-type silicon carbide layer 41, the p-type silicon carbide layer 42 doped with a p-type impurity such as aluminum, for example, is formed by epitaxial growth. The p-type silicon carbide layer 42 has a thickness t3 and an impurity concentration that may be, for example, about 1.3 µm and about $4.0 \times 10^{17}/cm^3$, respectively. As a result, the semiconductor substrate (semiconductor wafer) 40 is formed in which the n⁻-type silicon carbide layer 41 and the p-type silicon carbide layer 42 are sequentially stacked in order stated on the n⁺-type starting substrate 1.

Next, by photolithography and ion implantation of an n-type impurity such as phosphorus (P), for example, in the surface layer of the p-type silicon carbide layer 42, the n⁺-type source region 5 is selectively formed. Next, by photolithography and ion implantation of a p-type impurity such as aluminum, in the surface layer of the p-type silicon carbide layer 42, the p⁺⁺-type contact region 6 is selectively formed in contact with the n⁺-type source region 5. A sequence in which the n⁺-type source region 5 and the p⁺⁺-type contact region 6 are formed may be interchanged. A part of the p-type silicon carbide layer 42 other than the n⁺-type source region 5 and the p⁺⁺-type contact region 6 constitutes the p-type base region 4.

In the above ion implantations, for example, a resist film or an oxide film may be used as an ion implantation mask. Next, for all of the diffusion regions (the first and the second p⁺-type regions 31, 32, the n-type current spreading region 3, the n⁺-type source region 5, and the p⁺⁺-type contact region 6) formed by ion implantation, heat treatment (activation annealing) for activating impurities is performed, for example, at a temperature of about 1700 degrees C. for about 2 minutes. The activation annealing may be performed once for all of the diffusion regions collectively after formation, or may be performed each time a diffusion region is formed by ion implantation.

Figure 6:
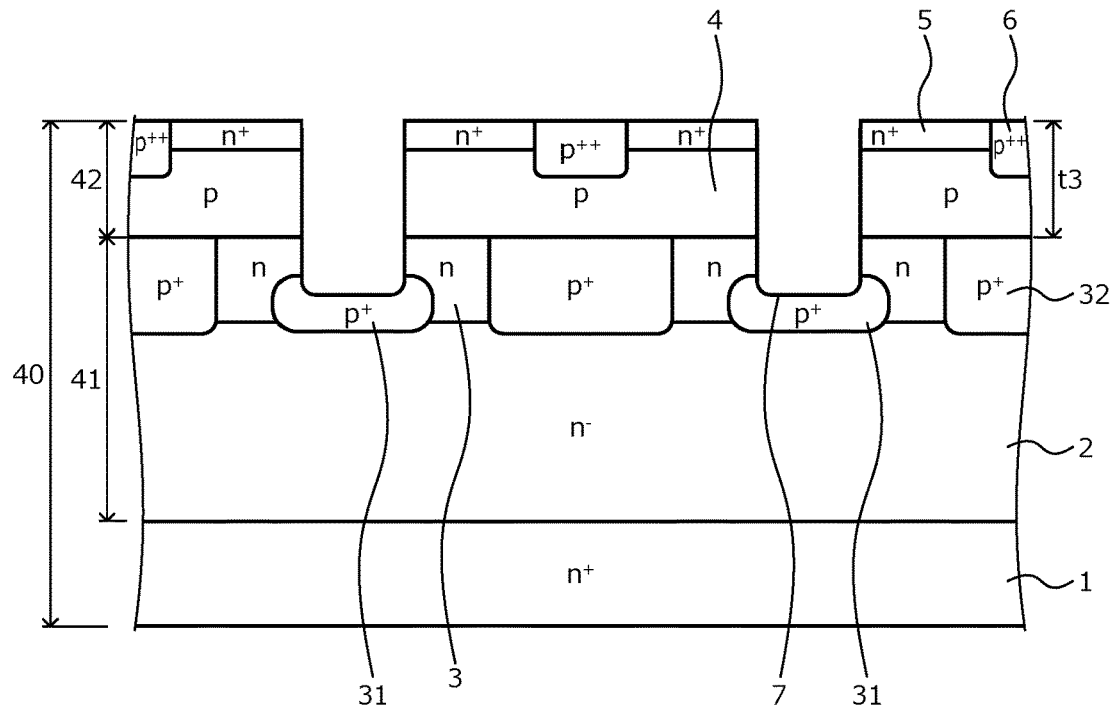
FIG. 6 is a cross-sectional view of the semiconductor device according to the embodiment during manufacture.

Next, as depicted in FIG. 6, by photolithography and etching, the trench 7 is formed penetrating the n⁺-type source region 5 and the p-type base region 4, and reaching the p⁺-type region 31 in the n-type current spreading region 3. The trench 7, as viewed from the front surface side of the semiconductor substrate 40, for example, may be disposed in a striped layout extending in a direction parallel to the front surface of the semiconductor substrate 40, or may be disposed in a matrix-like layout. As an etching mask for forming the trench 7, for example, a resist film or an oxide film may be used.

Figure 7:
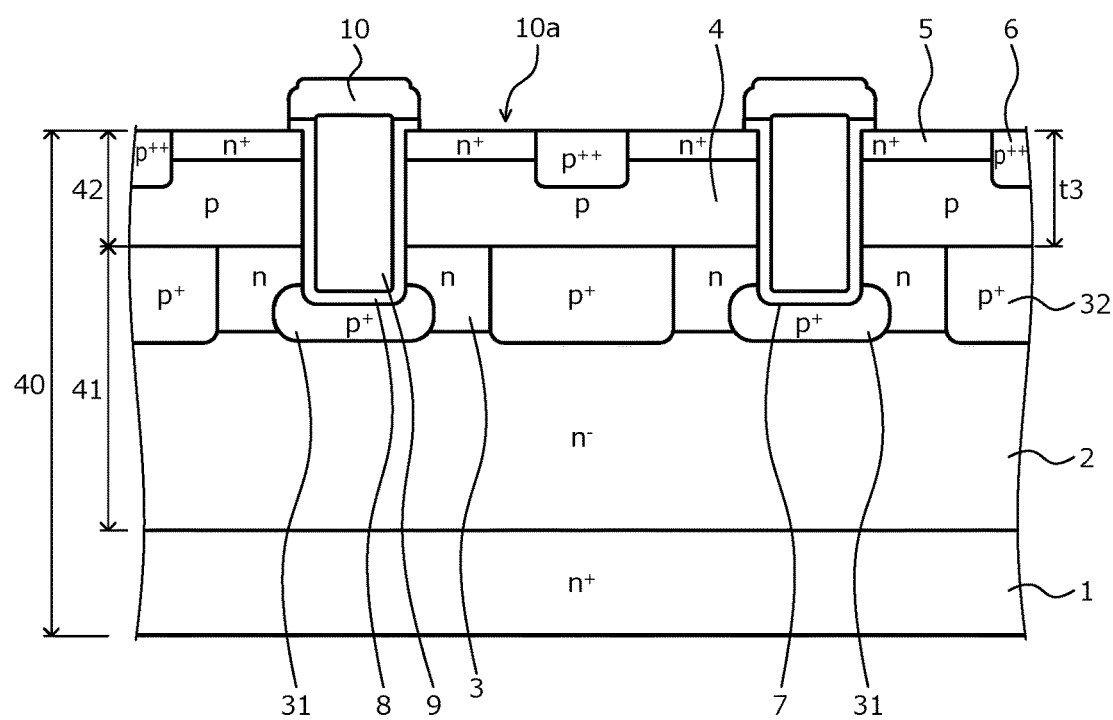
FIG. 7 is a cross-sectional view of the semiconductor device according to the embodiment during manufacture.

Next, as depicted in FIG. 7, along the surface (i.e., surfaces of the n⁺-type source region 5 and the p⁺⁺-type contact region 6) of the semiconductor substrate 40 and the inner wall of the trench 7, an oxide film constituting the gate insulating film 8 is formed. The gate insulating film 8 may be formed, for example, by thermal oxidation of the surface of the semiconductor substrate 40 and the inner wall of the trench 7 by heat treatment in an oxygen ($O_2$) atmosphere at a temperature of about 1000 degrees C. Further, the gate insulating film 8 may be deposited by a chemical reaction of a high temperature oxide (HTO).

Next, a poly-silicon (poly-Si) layer doped with, for example, phosphorus is deposited on the gate insulating film 8 so as to be embedded in the trench 7. Subsequently, the poly-silicon layer is patterned and a part thereof constituting the gate electrode 9 is left in the trench 7. At this time, the poly-silicon layer may remain so as to protrude out from the front surface of the semiconductor substrate 40, or the poly-silicon layer may be etched so as to remain below the substrate front surface.

Next, the interlayer insulating film 10 is formed on the entire front surface of the semiconductor substrate 40 so as to cover the gate insulating film 8 and the gate electrode 9, the interlayer insulating film 10 having a thickness of, for example, about 1 µm. The interlayer insulating film 10 may be, for example, a phosphosilicate glass (PSG). Next, the interlayer insulating film 10 and the gate insulating film 8 are patterned, forming the contact hole 10a and exposing the n⁺-type source region 5 and the p⁺⁺-type contact region 6. Next, by heat treatment (reflow), the interlayer insulating film 10 is planarized.

Figure 8:
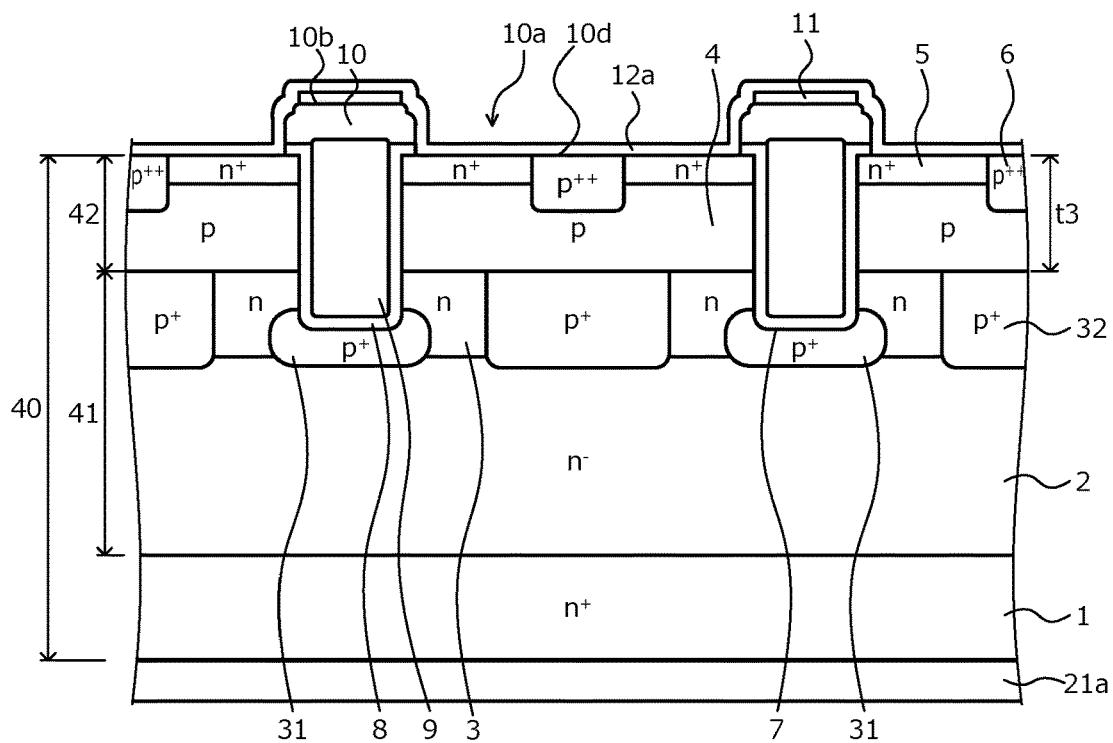
FIG. 8 is a cross-sectional view of the semiconductor device according to the embodiment during manufacture.

Next, as depicted in FIG. 8, the first TiN film 11 is formed so as to cover the interlayer insulating film 10 and thereafter, by photolithography and etching, the first TiN film 11 is partially removed to remain covering a part of the interlayer insulating film 10. At this time, the first TiN film 11 is partially removed so that a part thereof in contact with the front surface of the semiconductor substrate 40 does not remain and, for example, the first TiN film 11 remains only on the top 10b of the interlayer insulating film 10.

Next, for example, by sputtering, a Ni film 12a is formed spanning from the bottom 10d of the contact hole 10a to on the interlayer insulating film 10 and the first TiN film 11. For example, by sputtering, a Ni film 21a is formed on the entire rear surface of the semiconductor substrate 40. The Ni films 12a, 21a each may have a thickness in a range, for example, from 20 nm to 50 nm.

Next, for example, Si atoms in the semiconductor substrate 40 and Ni atoms in the Ni films 12a, 21a are cause to react by heat treatment at a temperature in a range of about 950 degrees C. to 1000 degrees C. As a result, a part of the Ni film 12a on the bottom 10d of the contact hole 10a is converted to a silicide, forming the NiSi film 12. In addition, the Ni film 21a is converted to a silicide, forming on the entire rear surface of the semiconductor substrate 40, a NiSi film that constitutes the drain electrode 21.

When a TiSi film is formed instead of the NiSi film 12, a Ti film is formed instead of the Ni film 12a, and a part of Ti film on the bottom 10d of the contact hole 10a is caused to react with the semiconductor substrate 40 to generate a silicide. When a TiSi film is used for the drain electrode 21, a Ti film is formed instead of the Ni film 21a and the Ti film is caused to react with the semiconductor substrate 40 to generate a silicide.

Next, by photolithography and etching, a part of the Ni film 12a excluding the NiSi film 12 is removed. As a result, the NiSi film 12 that forms an ohmic contact with the semiconductor substrate 40 remains on the bottom 10d of the contact hole 10a. As this time, when residue of the Ni film 12a excluding the NiSi film 12 remains after etching, Ni atoms diffuse toward the interlayer insulating film 10 and the reliability of the MOS gate decreases. Therefore, the Ni film 12a, exclusive of the NiSi film 12, may be sufficiently etched so as not to remain after etching.

Next, for example, by sputtering, the Ti film 13 is formed along the front surface of the semiconductor substrate 40 so as to cover the first TiN film 11 and the NiSi film 12. Next, for example, by sputtering, the second TiN film 14 is formed on the Ti film 13, along the front surface of the semiconductor substrate 40. Next, for example, by sputtering, the Al alloy film 15 is formed on the second TiN film 14 so as to be embedded in the contact hole 10a. The Al alloy film 15 may have a thickness of, for example, about 5 µm.

Next, by photolithography and etching, the Ti film 13, the second TiN film 14, and the Al alloy film 15 are patterned to remain in the active region only. As a result, the source electrode 16 is formed constituted by the first TiN film 11, the NiSi film 12, the Ti film 13, the second TiN film 14, and the Al alloy film 15. Together with the source electrode 16, a gate pad (not depicted) of the stacked structure of the source electrode 16 may be formed.

Next, for example, by sputtering, for example, a Ti film, a Ni film and a gold (Au) film are stacked in order stated on the surface of the drain electrode 21, forming the drain pad 22. Next, the first protective film 19 is formed so as to cover the source electrode 16. By photolithography and etching, the first protective film 19 is selectively removed, opening a part corresponding to a mounting region of the terminal pin 18.

Next, by a general pre-plating process, a part of the source electrode 16 exposed in an opening 19a of the first protective film 19 is processed to be in a clean state suitable for plating. Next, by a plating process, the plating film 17 is formed at a part of the source electrode 16 exposed at the opening 19a of the first protective film 19. At this time, the first protective film 19 functions as a mask that suppresses wetting and spreading of the plating film 17. The plating film 17 may have a thickness of, for example, about 5 μm.

Next, the second protective film 20 is formed so as to cover the boundary of the plating film 17 and the first protective film 19. Next, the terminal pin 18 is mounted on the plating film 17 by the solder layer (not depicted). At this time, the second protective film 20 functions as a mask that suppresses wetting and spreading of the solder layer. Thereafter, the semiconductor wafer is diced (cut), forming individual chips, whereby the MOSFET depicted in FIG. 1 is completed.

Figure 9:
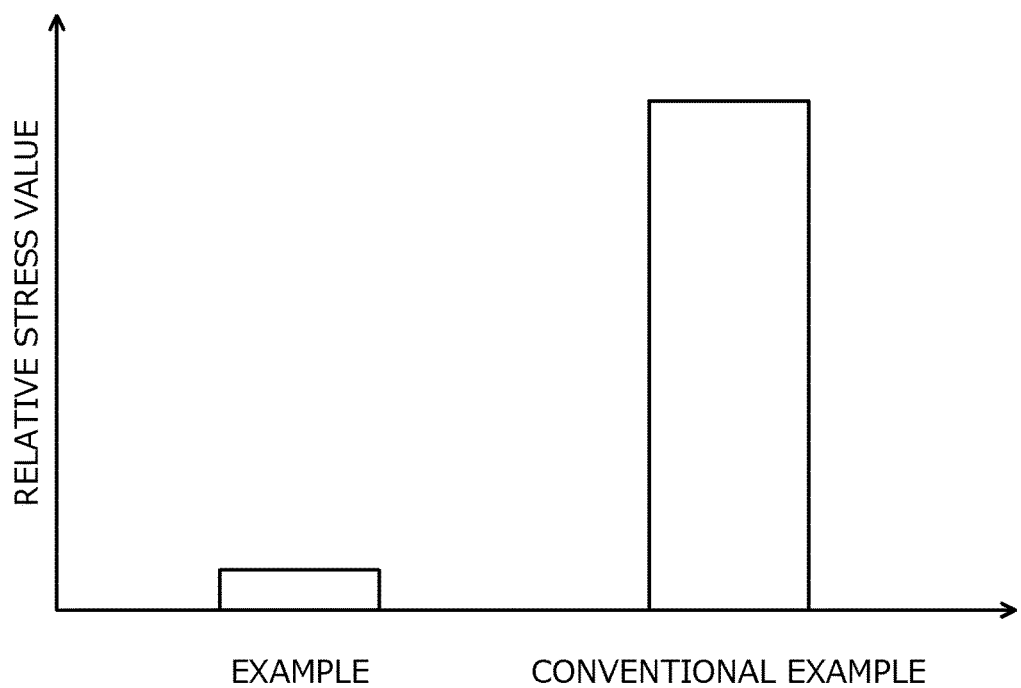
FIG. 9 is a characteristics diagram of stress values applied to a first TiN film of an Example.

The stress applied to the first TiN film 11 was verified. FIG. 9 is a characteristics diagram of stress values applied to a first TiN film of an Example. FIG. 9 depicts results of measurement of the stress applied to the first TiN films 11, 111 respectively of a MOSFET (hereinafter, Example) having the described structure of the semiconductor device according to the embodiment (refer to FIG. 1) and a MOSFET (hereinafter, conventional example) having the structure of the conventional semiconductor device (refer to FIG. 11). In FIG. 9, relative values of the stress applied to the first TiN film 11 of Example and of the stress applied to the first TiN film 111 of the conventional example are shown as a bar graph.

The results depicted in FIG. 9 confirm that compared to the conventional example, with Example, the stress applied to the first TiN film 11 was reduced by 2 times or more. A reason for this is as follows. As described above, in the conventional example, at the contact site 111a with the semiconductor substrate 140, the stress applied to the first TiN film 111 is large. In contrast, in Example, the first TiN film 11 only covers a part of the surface of the interlayer insulating film 10 and does not contact the front surface of the semiconductor substrate 40. Therefore, in the first TiN film 11 on Example, a site where the stress is greater is not present.

Figure 10:
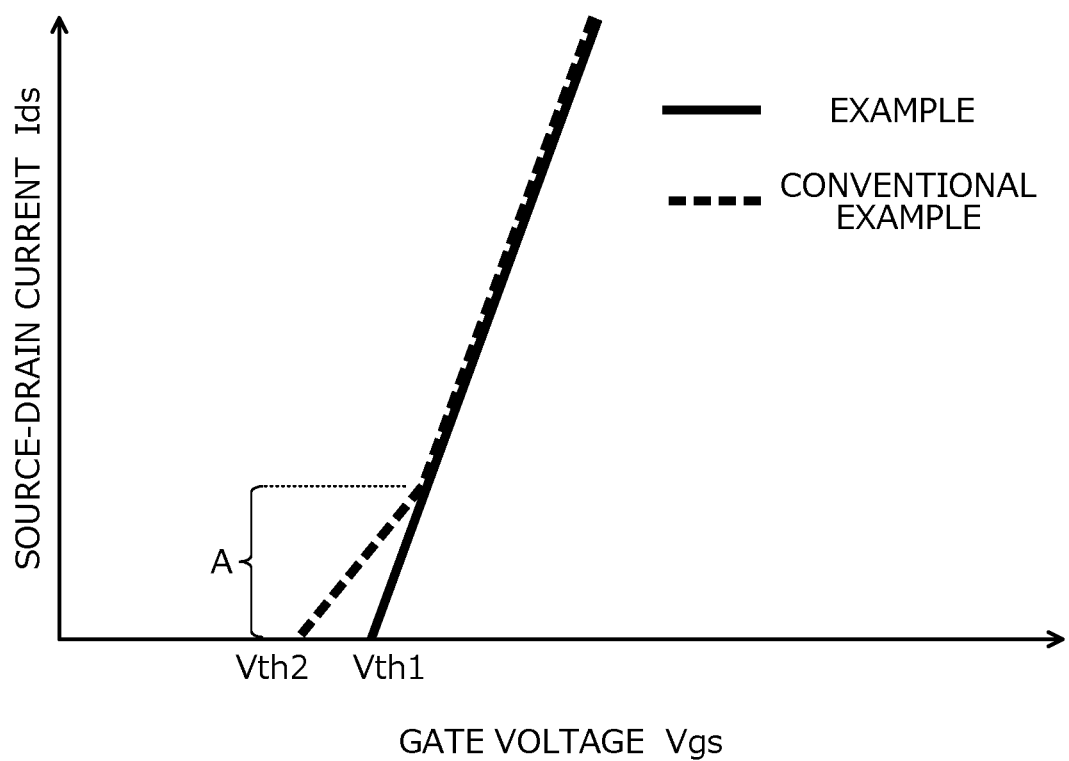
FIG. 10 is a characteristics diagram of a relationship of gate voltage and source-drain current of Example.

Further, for Example and the conventional example, a relationship of the gate voltage Vgs and the source-drain current Ids is depicted in FIG. 10. FIG. 10 is a characteristics diagram of a relationship of gate voltage and source-drain current of Example.

Results depicted in FIG. 10 confirm that in the conventional example, in a region A where the source-drain current Ids is low, a rise (the gate threshold voltage Vth2) of the gate voltage Vgs varies from the initial characteristics (design value) over time. A reason for this is that, as described, the stress applied to the first TiN film 111 is large at the contact site 111a with the semiconductor substrate 140, whereby stress over time from the first TiN film 111 to the gate insulating film 108 increases.

In contrast, Example was confirmed to show maintenance of a proportional relationship of the gate voltage Vgs and the source-drain current Ids over time and stable output characteristics. Even in the region A where the source-drain current Ids is low, a rise (the gate threshold voltage Vth1) of the gate voltage Vgs is maintained at the initial characteristics. A reason for this is that, as described, compared to the conventional example, the stress applied to the first TiN film 11 is small, whereby the stress from the first TiN film 11 to the gate insulating film 8 over time is also small.

As described, according to the embodiment, the first TiN film is provided so as to cover only a part of the surface of the interlayer insulating film and so as to not contact the bottom of the contact hole. The first TiN film does not contact the front surface of the semiconductor substrate, whereby no site is present where stress applied to the first TiN film from the terminal pin side, through a metal film other than the source electrode, becomes large. Therefore, stress from the first TiN film to the gate insulating film over time is small, enabling a rise of the gate voltage to be prevented from varying from the initial characteristics over time. Therefore, reliability of the MOS gate over time may be improved.

Further, when the MOS gate is disposed in a striped shape extending in a direction parallel to the front surface of the semiconductor substrate, the magnitude of the stress received from the terminal pin side differs for the direction in which the MOS gate extends in the striped shape and for a direction that is parallel to the front surface of the semiconductor substrate and orthogonal to the direction in which the MOS gate extends in the striped shape. Therefore, compared to a case where the MOS gate is disposed in a matrix-like shape as viewed from the front surface of the semiconductor substrate, the stress applied to the MOS gate is non-uniform. Therefore, according to the embodiment, in particular, an effect of the invention may be facilitated when the MOS gate is disposed in a striped shape extending in a direction parallel to the front surface of the semiconductor substrate.

In the embodiments of the present invention, various modifications are possible within a range not departing from the spirit of the invention. For example, in the embodiment, dimensions, impurity concentration, etc. of region may be variously set according to required specifications. Further, the present invention is not limited to a MOSFET and is further applicable to a MOS-type semiconductor device such as an IGBT or the like. The present invention is further applicable to a planar gate structure. When the present invention is applied to a planar gate structure, a width of the first TiN film 11 is equal to or greater than a width of the gate electrode.

In the embodiments, while an epitaxial substrate in which a silicon carbide layer is formed on a starting substrate by epitaxial growth is used, without limitation hereto, formation may be by, for example, all regions constituting the semiconductor device may be formed in a semiconductor substrate containing silicon carbide, for example, by ion implantation, etc. The present invention is further applicable to a wide bandgap semiconductor material (for example, gallium (Ga), etc.) other than silicon carbide. Further, the present invention is similarly implemented when the conductivity types (n-type, p-type) are reverse.

As described, in the first titanium nitride film, no site where the stress applied from the terminal pin is relatively greater is present and therefore, stress applied to the gate insulating film overtime from the first titanium nitride film also is also small. As a result, the rise of the gate voltage may be prevented from varying from the initial characteristics over time.

The semiconductor device according to the embodiments of the present invention achieve an effect in that the reliability of the MOS gate overtime may be improved.

As described, the semiconductor device according to the embodiments of the present invention is useful for MOS-type semiconductor devices having a double-sided cooling structure and is particularly suitable for a MOS-type semiconductor device in which a MOS gate is disposed in a striped layout extending in a direction parallel to the front surface of the semiconductor substrate.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
a semiconductor substrate having a first main surface and a second main surface, and containing a semiconductor material that has a bandgap wider than that of silicon;
a first semiconductor layer of a first conductivity type provided in the semiconductor substrate;
a second semiconductor layer of a second conductivity type provided in the semiconductor substrate, the second semiconductor layer being closer to the first main surface than is the first semiconductor layer, the second semiconductor layer being in contact with the first semiconductor layer and exposed at the first main surface;
a first first-conductivity-type semiconductor region of the first conductivity type selectively provided in the second semiconductor layer;
a trench penetrating the first first-conductivity-type semiconductor region and the second semiconductor layer, and reaching the first semiconductor layer;
a gate insulating film provided in the trench, along an inner wall of the trench;
a gate electrode provided on the gate insulating film in the trench;
an interlayer insulating film provided on the first main surface of the semiconductor substrate and covering the gate insulating film and the gate electrode;
a contact hole penetrating the interlayer insulating film in a depth direction and reaching the first main surface of the semiconductor substrate;
a first electrode forming an ohmic contact with the first first-conductivity-type semiconductor region and the second semiconductor layer in the contact hole;
a terminal pin soldered to the first electrode via a plating film; and
a second electrode provided on the second main surface of the semiconductor substrate, wherein
the first electrode includes:
a first titanium nitride film provided separated from the first main surface of the semiconductor substrate exposed in the contact hole, the first titanium nitride film covering a part of the interlayer insulating film,
a silicide film forming the ohmic contact and provided on the first main surface of the semiconductor substrate exposed in the contact hole,
an aluminum-based metal film containing aluminum as a principal component and provided on the first main surface of the semiconductor substrate, from on the interlayer insulating film, the aluminum-based metal film covering the first titanium nitride film and the silicide film.

2. The semiconductor device according to claim 1, wherein
the first titanium nitride film covers only a flat part of the interlayer insulating film, the flat part being parallel to the front main surface and on a first side of the interlayer insulating film, opposite a second side facing toward the gate electrode.

3. The semiconductor device according to claim 2, wherein
the first titanium nitride film terminates along the flat part before reaching a boundary of a side of the interlayer insulating film and the flat part.

4. The semiconductor device according to claim 1, wherein
the first titanium nitride film has a width that is at least a width of the trench.

5. The semiconductor device according to claim 1, wherein
the first electrode includes:
a titanium film that is between the first titanium nitride film and the aluminum-based metal film, and between the silicide film and the aluminum-based metal film, the titanium film being provided on the first main surface of the semiconductor substrate, from on the interlayer insulating film, the titanium film covering the first titanium nitride film and the silicide film, and
a second titanium nitride film provided on the titanium film, and
the aluminum-based metal film is provided on the second titanium nitride film.

6. The semiconductor device according to claim 1, further comprising:
a first second-conductivity-type semiconductor region of the second conductivity type, selectively provided in the first semiconductor layer, separated from the second conductor layer and beneath a bottom of the trench; and
a second second-conductivity-type semiconductor region of the second conductivity type, selectively provided in the first semiconductor layer between the trench and an adjacent trench, the second second-conductivity-type semiconductor region being separated from the first second-conductivity-type semiconductor region and in contact with the second semiconductor layer.

* * * * *